United States Patent
Suzuki et al.

[11] Patent Number: 6,026,034
[45] Date of Patent: Feb. 15, 2000

[54] BIT LINE RESET CIRCUIT OF MEMORY

[75] Inventors: Takaaki Suzuki; Shinya Fujioka; Yasuharu Sato, all of Kawasaki, Japan

[73] Assignee: Fujitsu Limited, Kanagawa, Japan

[21] Appl. No.: 09/073,928

[22] Filed: May 7, 1998

[30] Foreign Application Priority Data

May 13, 1997 [JP] Japan ................................ 9-122374

[51] Int. Cl.[7] .................................................. G11C 7/00
[52] U.S. Cl. ...................................... 365/190; 365/189.08
[58] Field of Search ........................... 365/190, 189.01, 365/204, 189.08

[56] References Cited

U.S. PATENT DOCUMENTS 5,222,041  6/1993  Nishimori et al. ................. 365/189.01
5,761,122  6/1998  Nakamura et al. ................ 365/185.21

FOREIGN PATENT DOCUMENTS

8-221983  8/1996  Japan .

*Primary Examiner*—David Nelms
*Assistant Examiner*—Hoal V. Ho
*Attorney, Agent, or Firm*—Nikaido Marmelstein Murray & Oram LLP

[57] ABSTRACT

Switching transistors 20, 22, 22P, 21, 23 and 23P and a portion of control circuit for transistors 20 and 21 constitutes a bit line reset circuit on memory cell side. In reading 'H' from the memory cell connected to a bit line BLC or *BLC, the both bit lines are set at a higher reset potential Vii, while in reading 'L', the both bit lines are reset at a lower reset potential Vss. Transfer gates 10 and 11 are turned off before sufficient amplification of a potential difference between the bit lines BL and *BL. The operation of restoring into a memory cell read destructively from is performed in parallel with the operation of bit line reset.

20 Claims, 11 Drawing Sheets

BIT LINE RESET CIRCUIT OF MEMORY

BACKGROUND OF THE INVENTION

1. Field of the Invention

The present invention relates to a having a bit line reset circuit (precharge circuit).

2. Description of the Related Art

Figure 9:
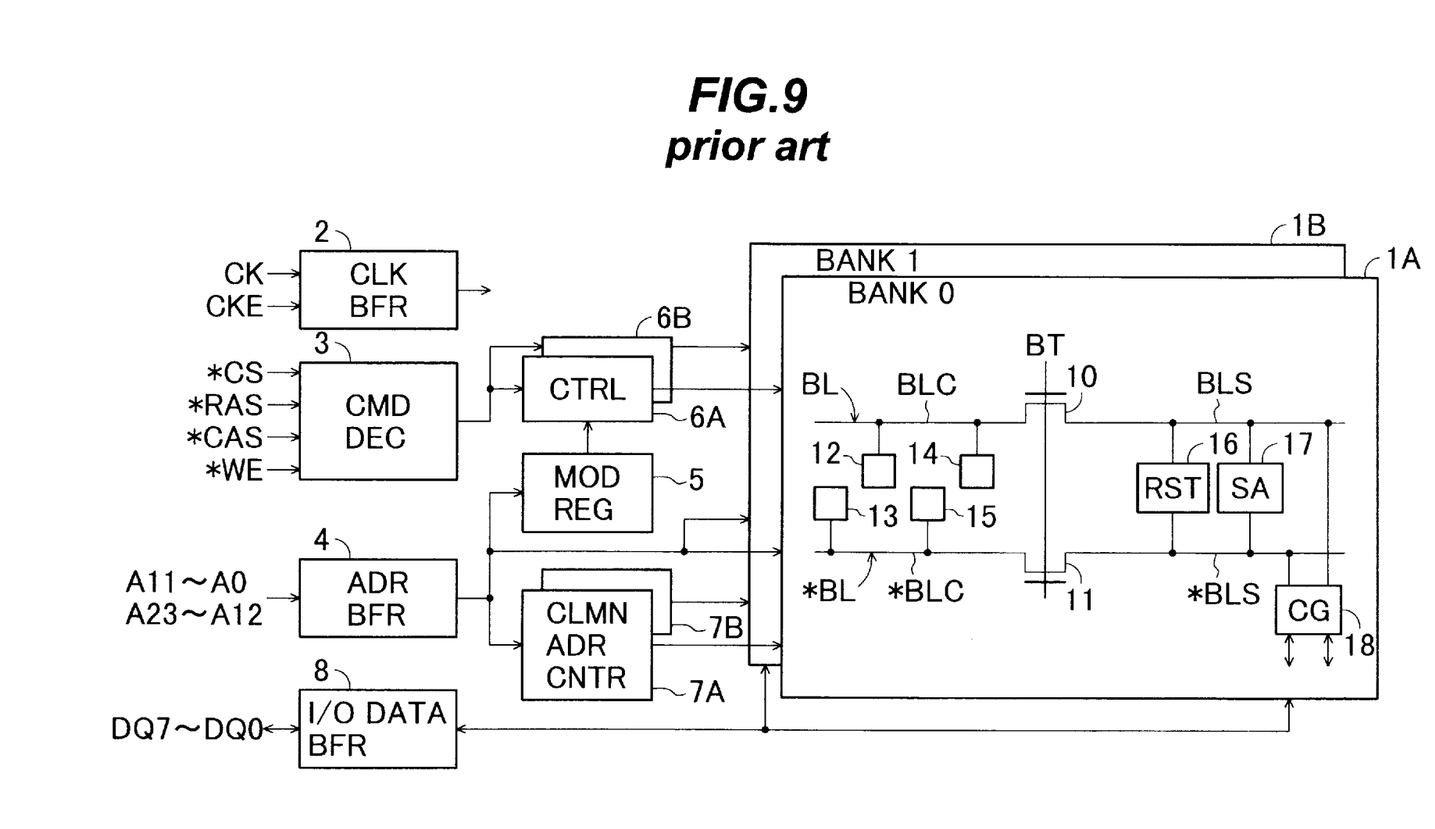
FIG. 9 is a schematic diagram showing a prior art synchronous DRAM.

FIG. 9 is a schematic diagram showing a structure of a prior art synchronous DRAM (SDRAM). In the description hereinafter, generally a signal S or a signal line S is complementary with a signal *S or a signal line *S, respectively.

The SDRAM includes a DRAM core 1A of bank 0 and a DRAM core 1B of bank 1. The DRAM core includes a memory cell array, a row decoder, a column decoder, column gates and sense amplifiers.

A clock CK and a clock-enable signal CKE are applied through a clock buffer circuit 2 to each part in the memory and synchronous operation is performed.

A command decoder 3 issues a command corresponding to a combination of input signals, which are a chip select signal *CS, a row address strobe signal *RAS, a column address strobe signal *CAS and a write enable signal *WE, at the time when the clock rises. In the case where all of these signals are low, for example, a mode register set command is issued, and an operation mode is set by an address provided through an address buffer circuit 4 to a mode register 5. The operation mode has a CAS latency, a burst length and a burst type. An active command ACT, a read command READ and a write command WRIT, etc. from the command decoder 3 are provided to a control circuit 6A or 6b, which in turn provide various control signals to the DRAM cores 1A and 1B in response to the respective commands.

The bank select bit A23 which is the MSB of the bits A23 to A12 held in a higher order address buffer register of an address buffer circuit 4 causes one of the DRAM cores 1A and 1B to be selected, while the row address bits A22 to A12 cause a word line in the selected DRAM core 1A or 1B to be selected. The lower order address of A11 to A0 is loaded in a column address counter 7A or a column address counter 7B thereby to select a column in the selected DRAM core 1A or 1b. In reading data, the data on the bit line pair of this column is read out on a data bus line pair and retrieved outside through a data buffer circuit 8. In writing data, the data held in an I/O data buffer circuit 8 is transmitted through the data bus line pair and the column gates to a bit line pair and written in the memory cell selected by the word line. In the case where the burst length is 2 or more, a column address counter 7A or 7B is incremented by clock, so that data are read or written successively.

FIG. 9 schematically shows a circuit connected to a pair of bit lines BL and *BL as part of the DRAM core 1a.

The bit line BL is divided into a cell-side bit line BLC and a bit line BLS on sense amplifier side by a transfer gate 10. The bit line *BL is divided into a cell-side bit line *BLC and a bit line *BLS on sense amplifier side by a transfer gate 11. To each of the bit lines BLC and *BLC a plurality of memory cells are connected. In FIG. 9, for simplicity, only memory cells 12 and 13 are shown connected to the bit lines BLC and *BLC, respectively. To the bit line BLC a dummy cell 14 for a plurality of memory cells is connected, and to the bit line *BLC a dummy cell 15 for a plurality of memory cells is connected.

Between the bit line BLS and the bit line *BLS, A bit line reset circuit 16 for resetting a potential of the bit lines BL and *BL, a sense amplifier 17 for amplifying the potential difference between the bit line BL and the bit line *BL and a column gate 18 for turning on/off the data line pair between the bit lines BLS and *BLS are connected.

Now, referring to FIG. 10, an explanation will be given of the operation of reading data from the memory cell 12 in the case where the reset potential of the bit lines BL and *BL is Vss (0 V) and 'H' (an internal power supply potential Vii, for example, 2.5 V) is held in the memory cell 12.

(1) Active Command ACT

The following operation is performed in response to an active command ACT issued from the command decoder 3.

The higher order address of A23 to A12 is held in the higher order address register of the address buffer circuit 4, the DRAM core 1A is selected by a bank select bit A23='0', and a word line, a dummy word line and a gate control signal BT corresponding to the row address of A22 to A12 is activated, so that the transfer gates of the memory cell 12 and the dummy cell 15 and the transfer gates 10 and 11 are turned on. Positive charges 2Q and Q are provided from the memory cell 12 and the dummy cell 15 to the bit lines BL and *BL, respectively, so that the potential of the bit lines BL and *BL are increased from Vss by 2ΔV and ΔV, respectively. Then, the sense amplifier 17 is activated, and the potential difference ΔV, for example, 0.2 V between the bit lines BL and *BL is amplified so that the potentials of the bit lines BL and *BL become Vii and Vss, respectively.

(2) Read Command READ

Then, a read command READ is issued from the command decoder 3 and the following operation is performed.

The column address of A11 to A0 is loaded in a column address counter 7A. A column gate 18 corresponding to the column address is turned on, and the data on the bit lines BL and *BL is transmitted through the data bus lines to the I/O data buffer 8, and is thus outputted outside. In the process, a pipeline processing is performed in synchronization with the clock. In the case where the burst length is 3, for example, the column address counter 7A is incremented twice for each clock under the same row address, and the data can be sequentially read out of the other two bit line pairs.

(3) Precharge Command PREC

Then, the following operation is performed in accordance with the issue of a precharge command PREC from the command decoder 3.

Figure 10:
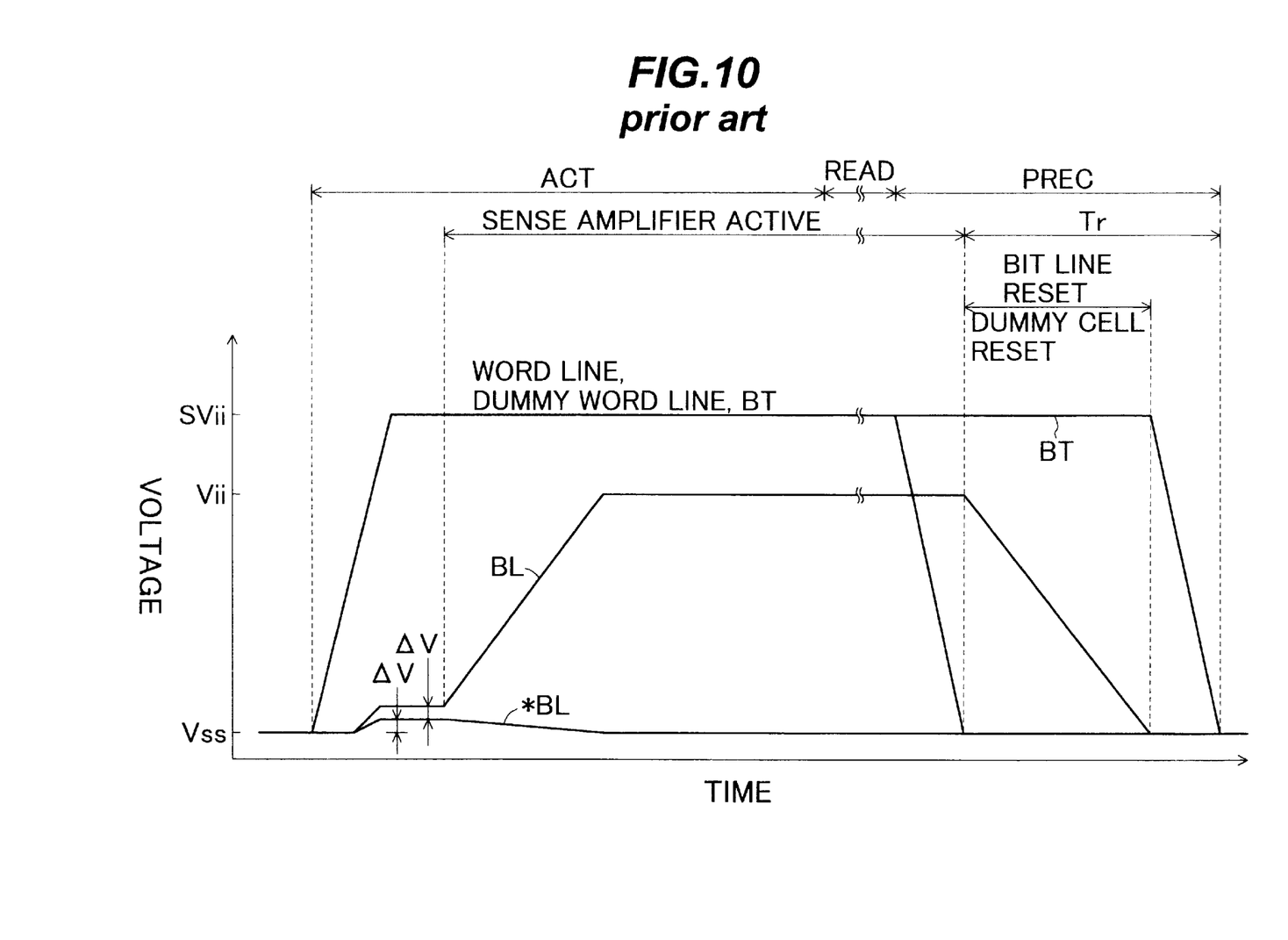
FIG. 10 is a schematic waveform chart showing the operation of the circuit of FIG. 9.

As shown in FIG. 10, the word lines and the dummy word lines are inactivated to terminate the restore operation. Then, the sense amplifier 17 is inactivated while activating the bit line reset circuit 16 for a period tr, thereby resetting the bit line to a potential Vss. The gate control signal BT is inactivated to close the transfer gates 10 and 11.

In the case where the DRAM core 1B is accessed after the command READA or WRITA is issued to the DRAM core 1a, the DRAM core 1B can be operated in parallel with the last reset operation of the DRAM core 1a. The reset operation in the DRAM core 1A thus is hidden.

In accessing the DRAM core 1A again with activating another word line, the next operation cannot be started before expiry of the reset period. The cycle of the clock CLK is about 10 ns. However, the reset time Tr is comparatively long and about 30 ns due to a multiplicity of memory cells connected to long bit line with comparatively large parasitic capacitance and resistance. Such problem is also encountered for a non-burst mode, and hence in a normal DRAM having a single bank.

For solving this problem, JP First Publication No. 8-221983 discloses such a method that another bit line reset circuit is also connected between BLC and *BLC, and the transfer gates 10 and 11 are turned off at a time point when the potential difference between BLC and *BLC is considered to have reached near the full amplitude during the operation of (2) above, while continuing the operation of (2) by the sense amplifier in parallel with the operation (3) of the memory cell described above.

Specifically, after the second rise of *CAS in the burst mode with column address changing under the same row address, the word line rise up, next the gate control signal BT becomes low to turn off the transfer gates 10 and 11. Then, BLC and *BLC are precharged to potential Vii/2 by the bit line reset circuit. The gate control signal BT falls down at timing after the lapse of a predetermined time from the activation of the sense amplifier 17.

When the reset potential is Vss=0 V, the change in the voltage Vc of the memory cell capacitor during the amplification operation of the sense amplifier 17 is expressed approximately as $Vc=Vii\{1-EXP(-t/\tau)\}$, where a time constant $\tau$=(the resistance of both the transfer gates at the memory cell and the bit line BL1)×(the capacitance of both the memory cell capacitor and the bit line BL1). As seen from this formula, the voltage Vc changes slowly up to Vii. For the above-described small voltage $\Delta V$ to be secured, the transfer gates 10 and 11 cannot be turned off until the voltage Vc reaches about 95% of the maximum voltage Vii. The above publication discloses the case in which the burst length is 4. For the burst length of 2, however, the operation (3) above will be started at about the end of the operation (2), therefore the two operations cannot be performed in parallel.

Further in the above publication which describes a circuit for precharging the bit lines on the memory cell side to a potential Vii/2, the load is larger because of precharging bit line pair, resulting in longer precharging time.

SUMMARY OF THE INVENTION

In view of the above-described problem, an object of the present invention is to provide a memory having a bit line reset circuit which can shorten RAS cycle time by isolating a bit line on memory cell side from sense amplifier side at an early time and by performing restore operation and bit line reset operation in parallel.

Another object of the present invention is to provide a memory having a bit line reset circuit of a smaller load.

A further object of the present invention is to provide a memory having a bit line reset circuit which can shorten RAS cycle time by isolating a bit line on memory cell side from sense amplifier side to reset sense amplifier side in parallel with selecting a memory sell.

In the 1st aspect of the present invention, there is provided a memory comprising: a bit line; a memory cell connected to the bit line; and a bit line reset circuit for resetting the bit line to a reset potential, the reset potential being a higher or lower one in reading a 'High' or 'Low' data, respectively, from the memory cell.

With the 1st aspect of the present invention, since the bit line is reset to higher potential when reading 'High' data from the memory cell connected to the bit line and to lower potential when reading 'Low' data from the memory cell, the operation of restoring into the memory cell from which the data has been read destructively can be performed in parallel with the operation of resetting the bit line, thereby shortening a RAS cycle time.

In the 2nd aspect of the present invention, there is provided a memory as defined in the 1st aspect, wherein the bit line reset circuit includes: a first switching element for providing the higher reset potential to the bit line; a second switching element for providing the lower reset potential to the bit line; and a reset control circuit for turning on the first switching element in reading a 'High' data from the memory cell, and for turning on the second switching element in reading a 'Low' data from the memory cell.

In the 3rd aspect of the present invention, there is provided a memory comprising: first and second bit lines; a memory cell connected to the first bit line; a bit line reset circuit for resetting the bit lines to a reset potential, the reset potential being a higher or lower one in reading a 'High' or 'Low' data, respectively from the memory cell.

With the 3rd aspect of the present invention, since the 1st and 2nd bit lines are reset to higher potential when reading 'High' data from the memory cell connected to the 1st bit line and to lower potential when reading 'Low' data from the memory cell, the operation of restoring into the memory cell from which the data has been read destructively can be performed in parallel with the operation of resetting the bit lines, thereby shortening a RAS cycle time.

In the 4th aspect of the present invention, there is provided a memory as defined in the 3rd aspect, wherein the bit line reset circuit includes: a first switching element for providing the higher reset potential to the first bit line; a second switching element for providing the lower reset potential to the first bit line; and a reset control circuit for turning on the first switching element in reading a 'High' data from the memory cell, and for turning on the second switching element in reading a 'Low' data from the memory cell.

In the 5th aspect of the present invention, there is provided a memory as defined in the 4th aspect, further comprising: first and second wiring; a first transfer gate connected between the first bit line and the first wiring; a second transfer gate connected between the second bit line and the second wiring; a sense amplifier connected between the first and second wiring; and a gate and amplifier control circuit for turning on both the first and second transfer gates and activating the sense amplifier to amplify a potential difference between the bit lines, and for turning off both the first and second transfer gates to reset the bit lines to the reset potential by the bit line reset circuit with activating the sense amplifier.

With the 5th aspect of the present invention, the 1st and 2nd bit lines can be isolated at an early time from the sense amplifier, and in addition the operations of amplifying the potential difference between the 1st and 2nd wiring, rewriting into the memory cell from which the data has been read destructively and resetting the bit lines can be performed in parallel, thereby further shortening a RAS cycle time.

In the 6th aspect of the present invention, there is provided a memory as defined in the 5th aspect, wherein the bit line reset circuit further includes: a common switching element connected between the first bit line and both of the first and second switching elements; and an equalizer switching element connected between the first and second bit lines, wherein the reset control circuit turns on the common switching element and the equalizer switching element when turning off the first and second transfer gate.

In the 7th aspect of the present invention, there is provided a memory as defined in the 5th aspect, further comprising: a dummy cell connected to the second bit line, the dummy cell having a capacitor to be reset with a potential inverted in logical level from that of the second bit line.

In the 8th aspect of the present invention, there is provided a memory comprising: first and second bit lines; a memory cell connected to the first bit line; first and second wiring; a first transfer gate connected between the first bit line and the first wiring; a second transfer gate connected between the second bit line and the second wiring; a sense amplifier connected between the first and second wiring; a bit line reset circuit having first and second switching elements connected in series between the first bit line and a reset potential conductor, and having third and fourth switching elements connected in series between the second bit line and the reset potential conductor, the first and third switching elements being controlled in inverse on/off of the first and second transfer gate, the second and fourth switching elements being controlled by the potential of the first or second wiring; a gate and amplifier control circuit for turning on both the first and second transfer gates and activating the sense amplifier to amplify a potential difference between the bit lines, and for turning off both the first and second transfer gates to reset the bit lines to the reset potential by the bit line reset circuit with activating the sense amplifier.

With the 8th aspect of the present invention, the load of the bit line reset circuit can be smaller.

In the 9th aspect of the present invention, there is provided a memory as defined in the 8th aspect, wherein the first and third switching element are controlled by the same control signal as that for the first and second transfer gates.

In the 10th aspect of the present invention, there is provided a memory as defined in the 8th aspect, wherein the first and third switching element are controlled by a control signal having an inverted logical level of a control signal for the first and second transfer gates.

In the 11th aspect of the present invention, there is provided a memory as defined in the 8th aspect, wherein the second switching element has a control input connected to the first wiring and the fourth switching element has a control input connected to the second wiring.

In the 12th aspect of the present invention, there is provided a memory comprising: first and second bit lines; a memory cell connected to the first bit line; first and second wiring; a first transfer gate connected between the first bit line and the first wiring; a second transfer gate connected between the second bit line and the second wiring; a sense amplifier connected between the first and second wiring; a bit line reset circuit connected to the first and second bit lines, for reset the first and second bit line to a reset potential; a wiring reset circuit connected to the first and second wiring, for reset the first and second wiring to the reset potential; and a control circuit for inactivating the sense amplifier, activating the wiring reset circuit to reset the wiring to the reset potential and selecting the memory sell with both the first and second transfer gate being off, for turning on both the first and second transfer gates and activating the sense amplifier to amplify a potential difference between the bit lines, and for turning off both the first and second transfer gates and activating the bit line reset circuit to reset the bit lines to the reset potential.

Other aspects, objects, and the advantages of the present invention will become apparent from the following detailed description taken in connection with the accompanying drawings.

DESCRIPTION OF THE PREFERRED EMBODIMENTS

Referring now to the drawings, wherein like reference characters designate like or corresponding parts throughout several views, preferred embodiments of the present invention are described below.

First Embodiment

Figure 1:
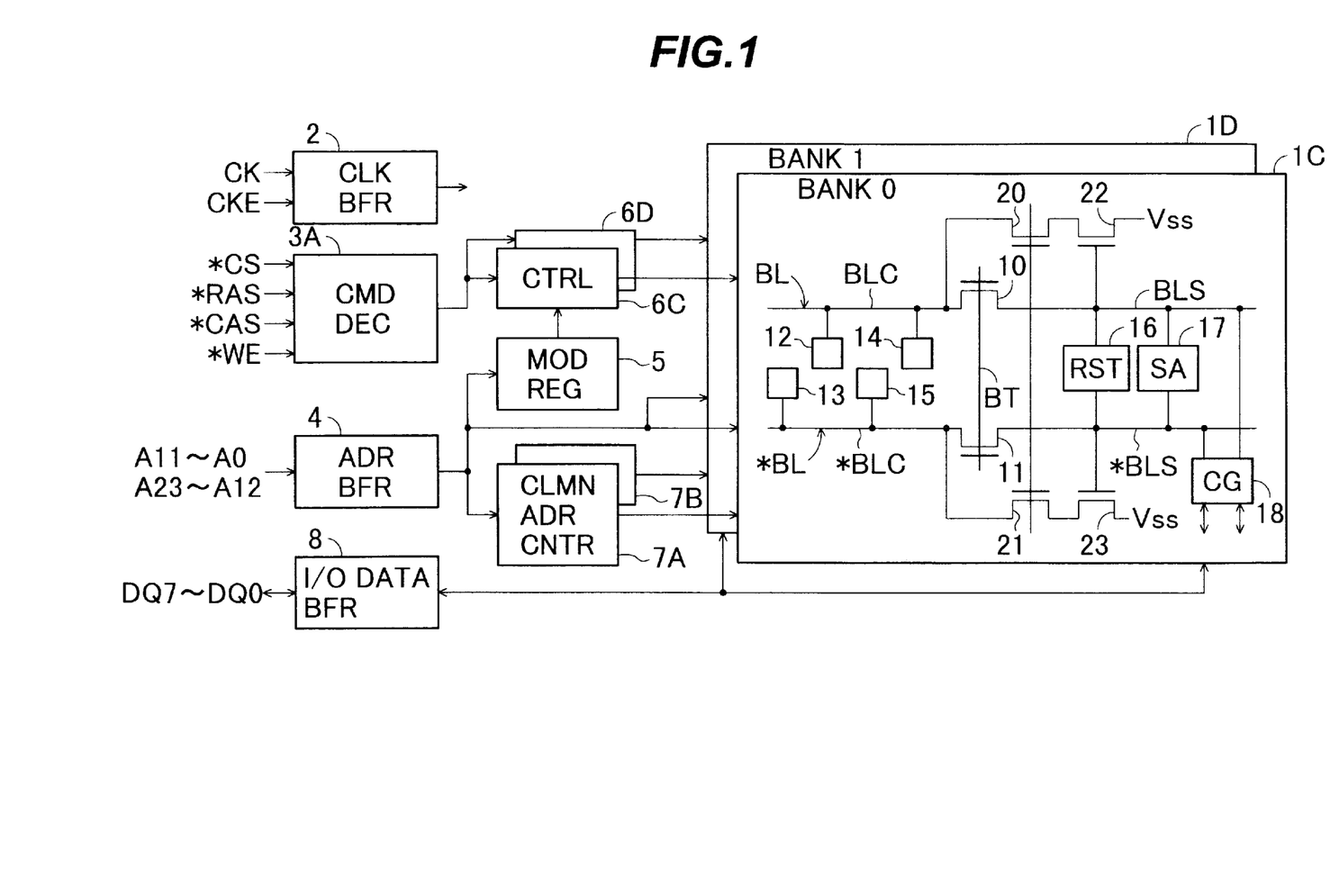
FIG. 1 is a schematic diagram showing a synchronous DRAM according to a first embodiment of the present invention.
Figure 2:
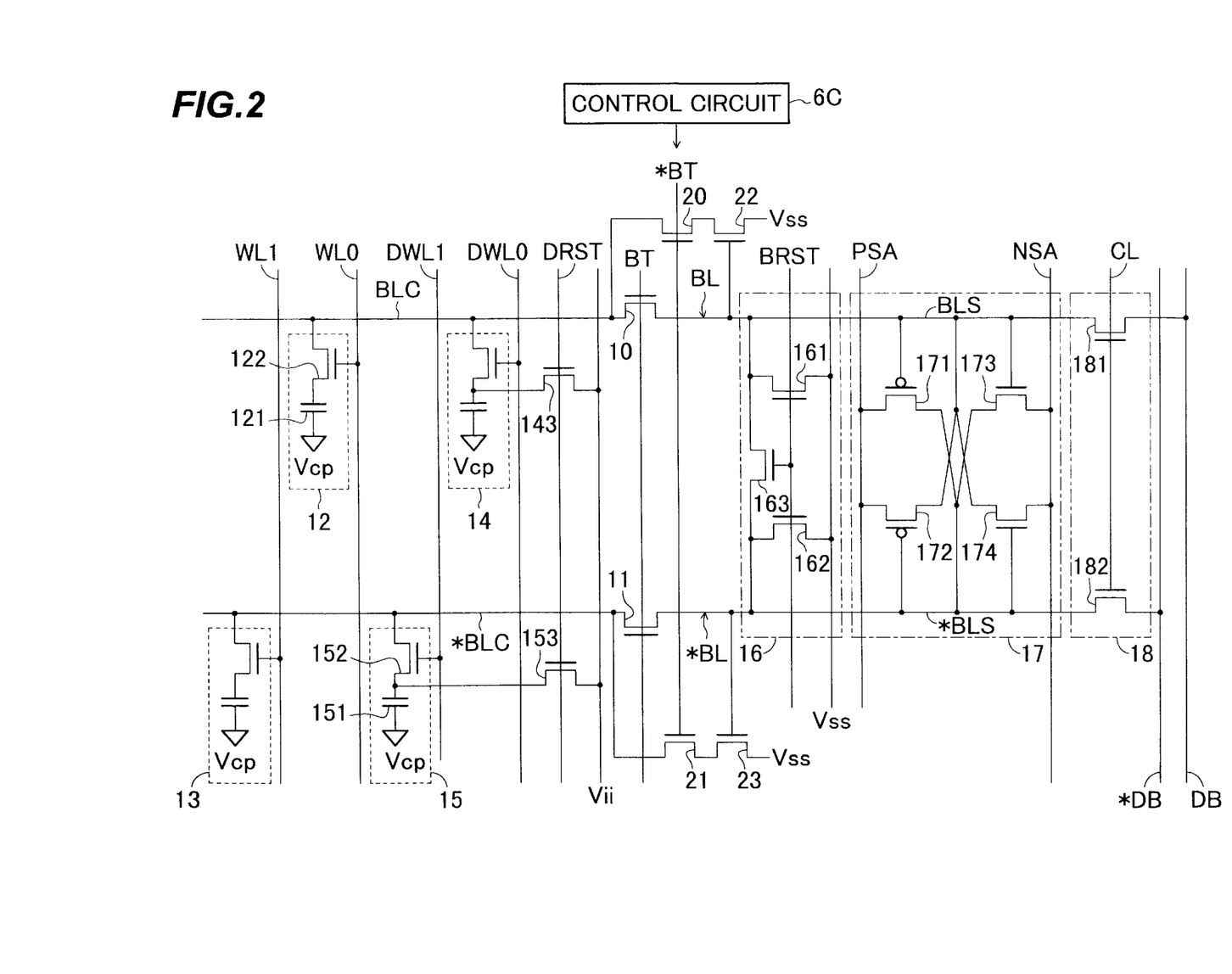
FIG. 2 is a circuit diagram showing part of the circuit of FIG. 1.

FIG. 1 is a schematic diagram as in FIG. 9 showing a structure of a synchronous DRAM according to a first embodiment of the present invention. FIG. 2 shows in detail the circuit described in the frame of a DRAM core 1C in FIG. 1.

DRAM cores 1C and 1D and control circuits 6C and 6D are similar to DRAM cores 1C and 1D and control circuits 6A and 6B in FIG. 9, respectively.

In FIG. 2, transistors 171 and 172 marked with o at the gates are PMOSFETs, and the other transistors are NMOSFETs. The bit line reset potential of this circuit is Vss. An internal power supply potential Vii is 2.5 V, an internal boost potential SVii is 3.8 V and a reference potential Vss is 0 V, for example. SVii is higher than Vii plus the threshold voltage of the MOS transistor. One end of the cell capacitor is applied with a cell plate potential Vcp=Vii/2. The capacitance of a capacitor 151 of a dummy cell 15 is one half that of a capacitor 121 of a memory cell 12. The amount of the charge held in the capacitor 151 by resetting the dummy cell is one half that of the charge held when 'H' (Vii) is held in the memory cell 12.

In reading data, a small potential difference ΔV of about 0.2 V between bit lines BL and *BL is amplified by a sense amplifier 17 to full swing. After that, transfer gates 10, 11 are turned off for resetting the potential of bit lines BLC and *BLC, this doesn't affect the potential of bit lines BLS and *BLS on the sense amplifier 17 side. This resetting operation is hidden since it is performed in parallel with the read operation from a column gate 18. The potential of the bit lines BLS and *BLS on the sense amplifier side is also required to be reset for preparing next access. In view of the fact that the bit lines on the sense amplifier side have smaller parasitic capacitance and resistance with shorter in length than the bit lines on the cell side, so the time of about 10 ns, i.e. one clock cycle, is sufficient for resetting the bit lines BLS and *BLS.

The potential of the bit lines BLC and *BLC is reset at Vss with the transfer gates 10 and 11 off. Therefore, an end of each of switching transistors 20, 21 is connected to the bit lines BLC and *BLC, so that the switching transistors 20, 21 are turns on/off by a complementary signal *BT of the gate control signal BT for the transfer gates 10 and 11, thus making it possible to apply the reset potential Vss through the switching transistors 20 and 21 to the bit lines BLC and *BLC, respectively.

When the bit line BLS is the reset potential Vss after amplification of the small potential difference ΔV between the bit lines BL and *BL, only the bit line *BLC need to be reset. On the other hand, when the bit line *BLS is the reset potential Vss after such amplification, the bit line BLC alone need to be reset. Therefore, switching transistors 22 and 23 are connected in series to the switching transistors 20 and 21, respectively, with the gates of the switching transistors 22 and 23 being connected to the bit lines BLS and *BLS, respectively.

The bit line reset circuit on the memory cell side is constructed of four transistors 20 to 23, the transistors 20 and 21 are turned on/off by the complementary signal *BT of the gate control signal BT, and the transistors 22 and 23 are turned on/off by the potentials of the bit lines BT and *BT, respectively, thus resulting in a smaller load of the bit line reset circuit with precharging only one bit line of the bit line pair.

Control signals in FIG. 2 are generated by a control circuit 6C.

Now, referring to FIG. 3, the operation of reading data from the memory cell 12 in the case where 'H' is held in the memory cell 12 will be described.

In initial state, bit lines BL and *BL, drive signal lines PSA and NSA, word lines, dummy word lines, a column select line CL, reset signals BRST and DRST and a gate control signal BT are the reference potential Vss. The electrode of the capacitor 151 of the dummy cell 15 on the transfer gate side is reset at potential Vii.

(1) Active Command ACTR

Under this condition, the following operation is performed by the control circuit 6C in response to an active command ACTR for read operation issued from a command decoder 3A.

The higher order address of A23 to A12 is held in the higher order address register of the address buffer circuit 4, and the DRAM core 1C is selected by the bank select bit A23='0'. The word line WL0 corresponding to the low address of A22 to A12, the dummy word line DWL1 corresponding to the lowest order bit A12 and the gate control signal BT are activated, thereby the transfer gates 122, 152, 10 and 11 are turned on, and the switching transistors 20 and 21 are turned off. Positive charge 2Q and Q are provided from the capacitors 121 and 151 to the bit lines BL and *BL, respectively, so that the potentials of the bit lines BL and *BL rise from Vss by 2ΔV and ΔV, respectively. Then, the sense amplifier 17 is activated, and the potential difference ΔV between the bit lines BL and *BL is amplified. Thus the potentials of the bit lines BL and *BL become Vii and Vss, respectively.

Signals on other bit line pairs not shown are also amplified in similar fashion, and in accordance with the memory contents before reading from the memory cells, one and the other of the bit line pairs become the potential Vii and Vss, respectively.

These processes complete the operation in response to the prior art active command ACT. For the active command ACTR for the read operation according to the present invention, the following first and second operations are added.

In the first operation, the word line WL0 and the dummy word line DWL1 transit from potential SVii to potential Vss and the transfer gates 122, 152 are turned off, thereby restoring 'H' in the memory cell 12 that has been destructively read from is completed. The same is performed about the other bit line pairs not shown.

In the second operation, the gate control signal BT transits to the potential Vss, and the gate control signal *BT transits to the potential SVii, thereby the transfer gates 10 and 11 are turned off, while the switching transistors 20 and 21 are turned on. The time point where the gate control signal *BT starts to rise is preferably retarded slightly from the time point when the gate control signal BT starts to fall. The bit lines BLS and *BLS are already at the potentials Vii and Vss, respectively. Therefore, the switching transistor 22 is on, and the switching transistor 23 is off. As a result, the bit line BLC is reset at the potential Vss with the bit line BLS maintained at the potential Vii. This is also the case with the other bit line pairs not shown, for which the bit lines on the cell side held at the potential Vii are reset at the potential Vss. The time Tcr for resetting the cell-side bit line is about 30 ns which is substantially the same as the bit line reset time in the prior art.

In this second operation, the dummy cell is reset in parallel with the resetting of the bit line described above. Namely, the pulse of the reset signal DRST is provided to the transfer gates 143 and 153 for a predetermined time, and the electrodes of the capacitors of the dummy cells 14 and 15 on transfer gate side are reset at the potential Vii. The same can be said of the other bit line pairs not shown.

(2A) Read Command READ

The read command READ from the command decoder 3A is issued substantially at the same time when the above second operation starts. In response to the issue of this read command READ, the following operation is performed in parallel with the second operation.

The column address of A11 to A0 are loaded in the column address counter 7A, and the transfer gates 181 and 182 of the column gate 18 corresponding to the column address are turned on. Thus the data on the bit lines BLS and *BLS are transmitted through the data bus lines DB and *DB, respectively, to the I/O data buffer circuit 8 of FIG. 1, and thus are outputted outside. In the process, the pipeline processing is performed in synchronization with the clock. If the burst length is 3, for example, the column address counter 7A of FIG. 1 is incremented twice for each clock and the data from the other two bit line pairs are read out sequentially with the same row address.

(3A) Precharge Command PREC

Then, the following operation is performed in response to the precharge command PREC issued from the command decoder 3A.

Figure 3:
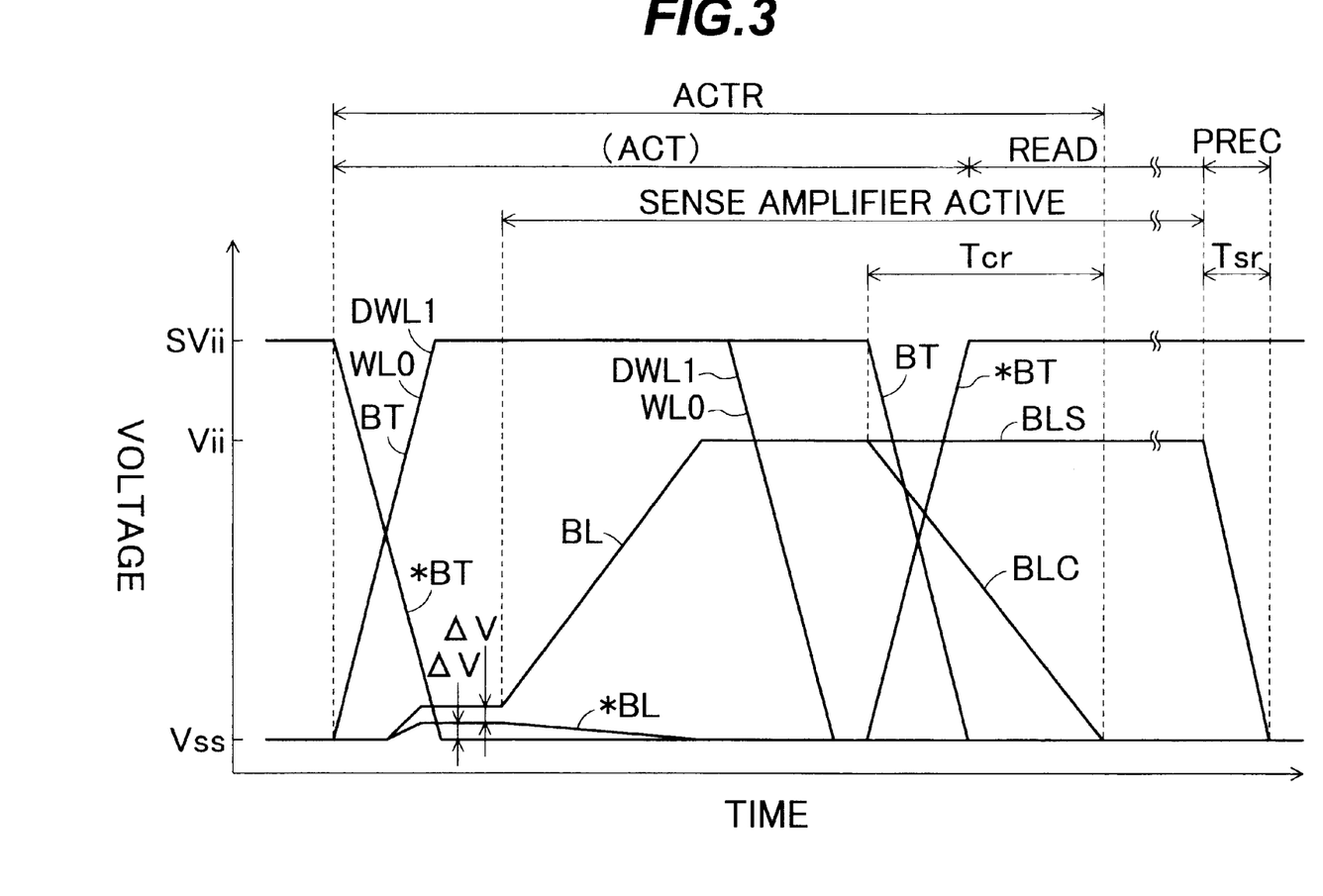
FIG. 3 is a schematic waveform chart showing the operation of the circuit of FIG. 2.

The column select line CL and the drive signal line PSA transit to the potential Vss, and the bit line BLS is reset to the potential Vss as shown in FIG. 3 by the pulse of the reset signal BRST. The time Tsr required for this resetting is about 10 ns or only one clock cycle.

Next, the variations of the first embodiment will be described.

Figure 3A:
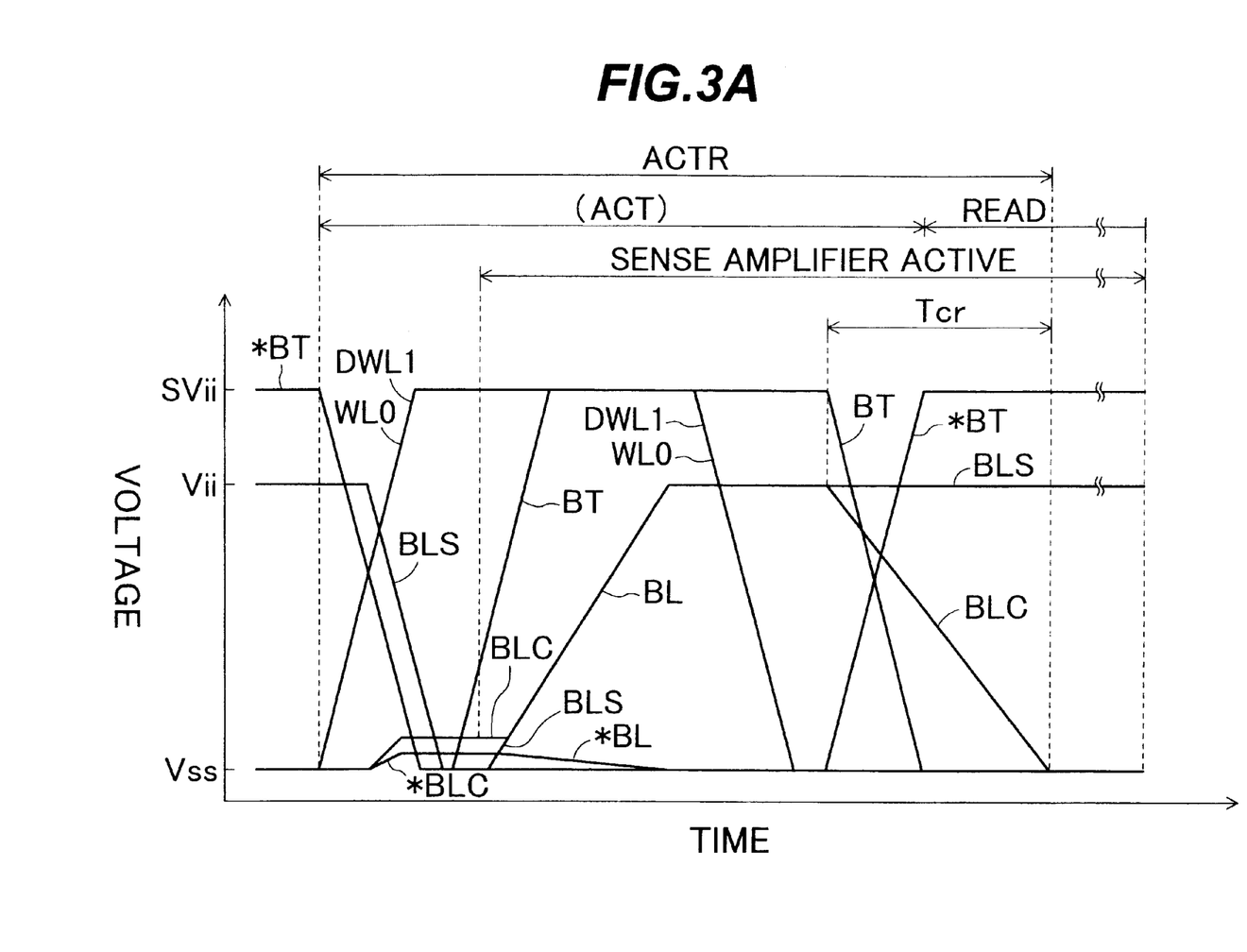
FIG. 3A is a schematic waveform chart showing another operation of the circuit of FIG. 2.

In the operation in response to the issue of the precharge command PREC, the transfer gates 10 and 11 are turned off. In the initial stage of the operation in response to the issue of the active command ACT, the transfer gates 10 and 11 are turned off. No problem is posed even if the time point when the control signal BT is started to activate is retarded slightly from the time point when a word line is started to activate as shown in FIG. 3A.

Therefore, without issuing the precharge command PREC, the operation of FIG. 3 in response to the precharge command PREC can be executed in parallel with the operation in response to the issue of the next active command ACT. Namely in FIG. 3A, the precharge operation of the reset circuit 16 is performed between the starting point of ACTR command operation and the starting of BT signal rising. In this case, the signal BT is not complementary with the signal *BT by way of exception.

The parallel operation is not substantially limited by the incorporation of PREC command operation into ACTR command operation and since the potential reset time for the bit line on the sense amplifier side is about 10 ns, the read cycle is further shortened by 10 ns, thereby achieving a higher operating speed.

When a read command READA with auto-precharge is issued in place of the read command READ, the operation in response to the read command READ is performed and next the operation in response to the precharge command PREC is performed. Likewise, when a write command WRITA with auto-precharge is issued, the operation in response to the write command WRIT is performed and next the operation in response to the precharge command PREC is performed.

In view of the fact that the read command READ is issued in parallel with the starting of the second operation, the second operation can be incorporated in the operation in response to the issue of the read command READ.

Also, it may be defined the read command ACT&READA with active and auto-precharge for automatically performing the operation in response to the command READA after the operation in response to the command ACTR.

Figure 4A:
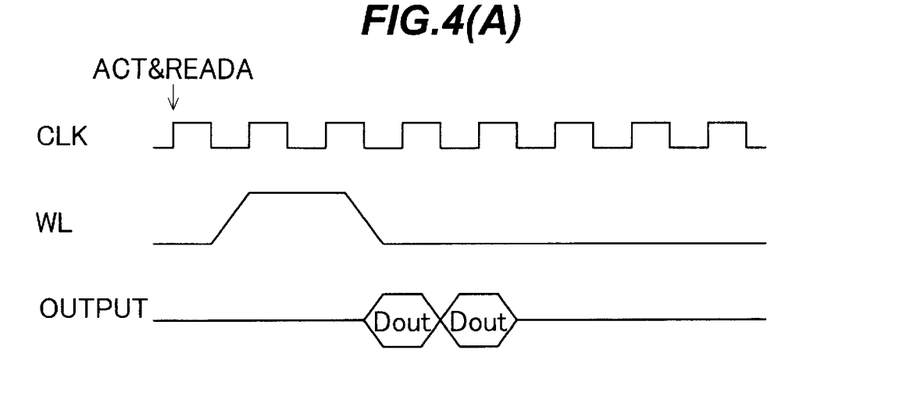
FIGS. 4(A), 4(B) and 4(C) are time charts schematically showing the operation of the circuit of FIG. 1.

FIG. 4(A) schematically shows the operation after issue of the command ACT&READA. In this case, the RAS latency is 3 and the burst length is 2.

In a write operation, the transfer gates 10 and 11 have to be on while writing. Therefore, the same active command ACT as in the prior art is performed. So, it may be defined the write command ACT&WRITA with active and auto-precharge for automatically performing the operation in response to the command WRITA after the operation in response to the command ACT.

Figure 4B:
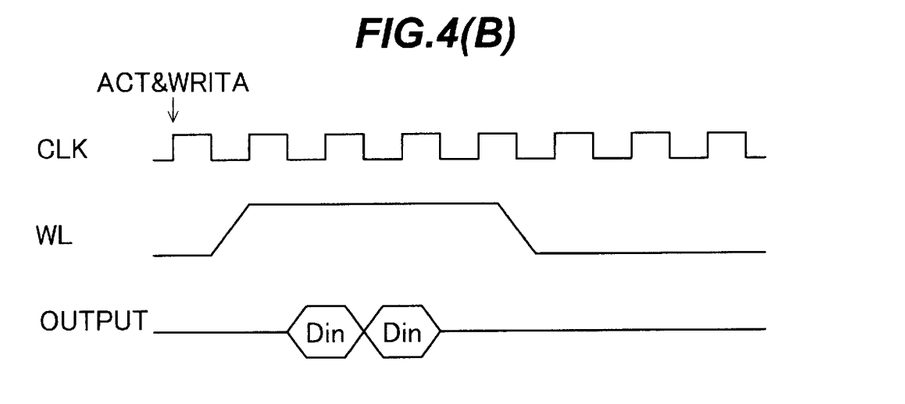

FIG. 4(B) schematically shows the operation after issue of the command ACT&WRITA, in which the RAS latency is 2 and the burst length is 2.

Figure 4C:
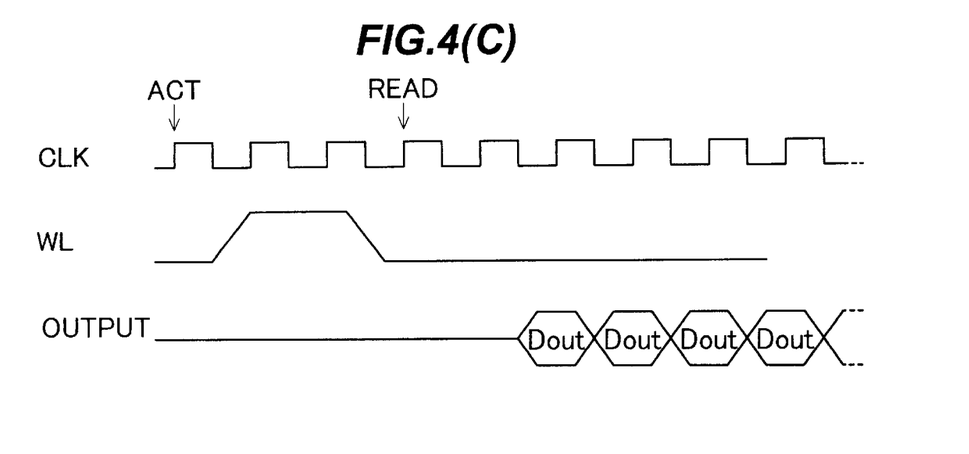

FIG. 4(C) shows the page-read operation, i.e. the operation of reading the data by incrementing the column address until maximum, e.g. 1024 times for a selected word line. In this case, the CAS latency is 2. Although the active command ACT and the read command READ are separated as in the prior art, the embodiment is different from the prior art in that the above-described first and second operations are performed in response to the active command ACT.

Second Embodiment

Figure 5:
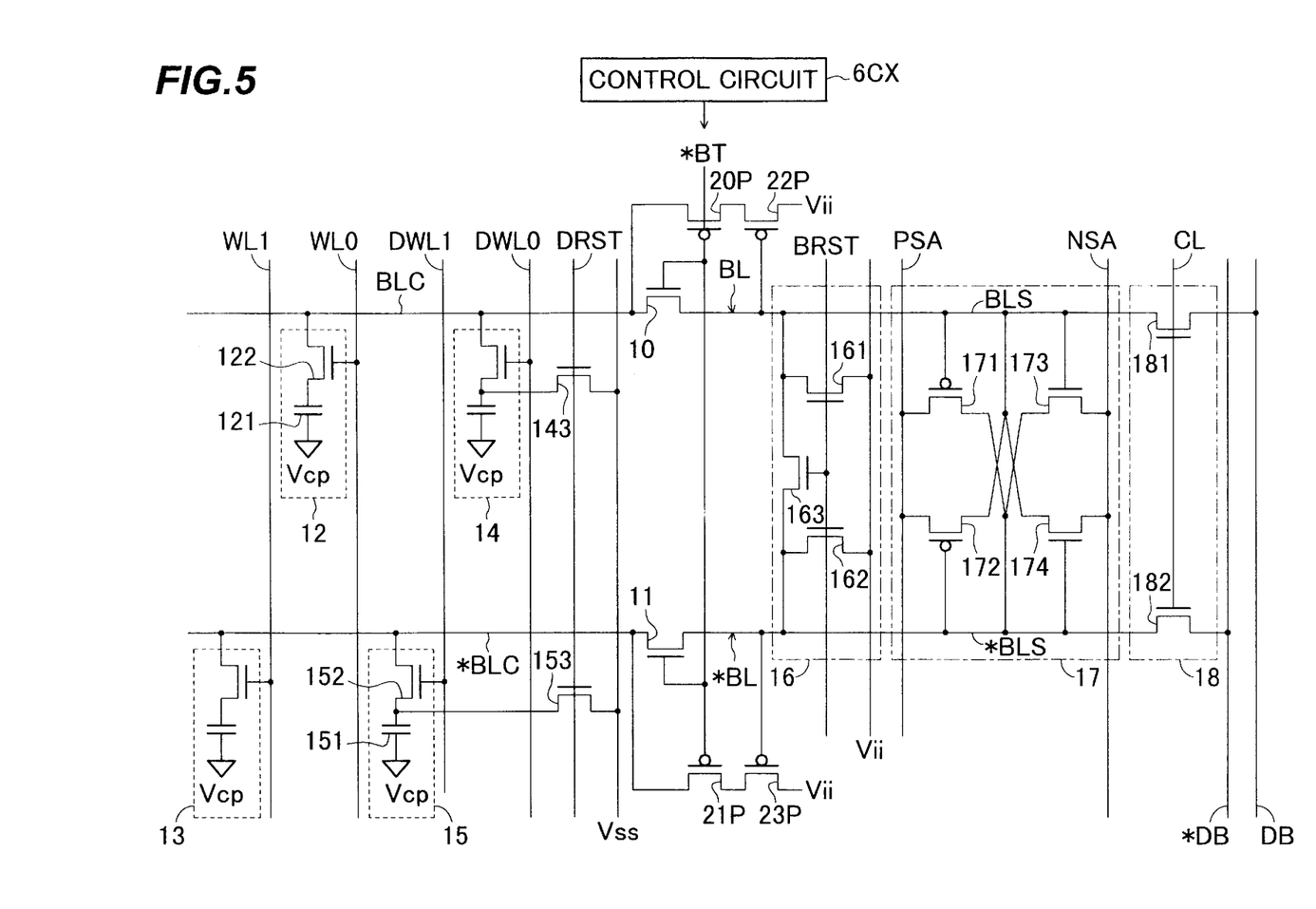
FIG. 5 is a circuit diagram as in FIG. 2 according to a second embodiment of the present invention.

FIG. 5 shows a circuit similar to that of FIG. 2 according to a second embodiment of the present invention.

This circuit represents the case in which the bit line potential is reset at Vii. Instead of the switching transistors 22 and 23 of FIG. 2, switching transistors 22P and 23P each being a PMOSFET are used. In the case where the potential of the bit line BL is Vii, the bit line BLC is not required to be reset, so the switching transistor 22P is turned off by the potential Vii of the bit line BLS and the switching transistor 23P is turned on by the potential Vss of the bit line *BLS.

Further, the transfer gates 10 and 11 and the gates of the switching transistors 20P and 21P are controlled by the same signal BT with employing the switching transistors 20P and 21P each being a PMOSFET instead of the switching transistors 20 and 21 of FIG. 2, respectively.

Since the bit line potential is reset at Vii, the dummy cells 14 and 15 are reset at the potential Vss.

Control signals in FIG. 5 are generated by a control circuit 6CX.

Figure 6:
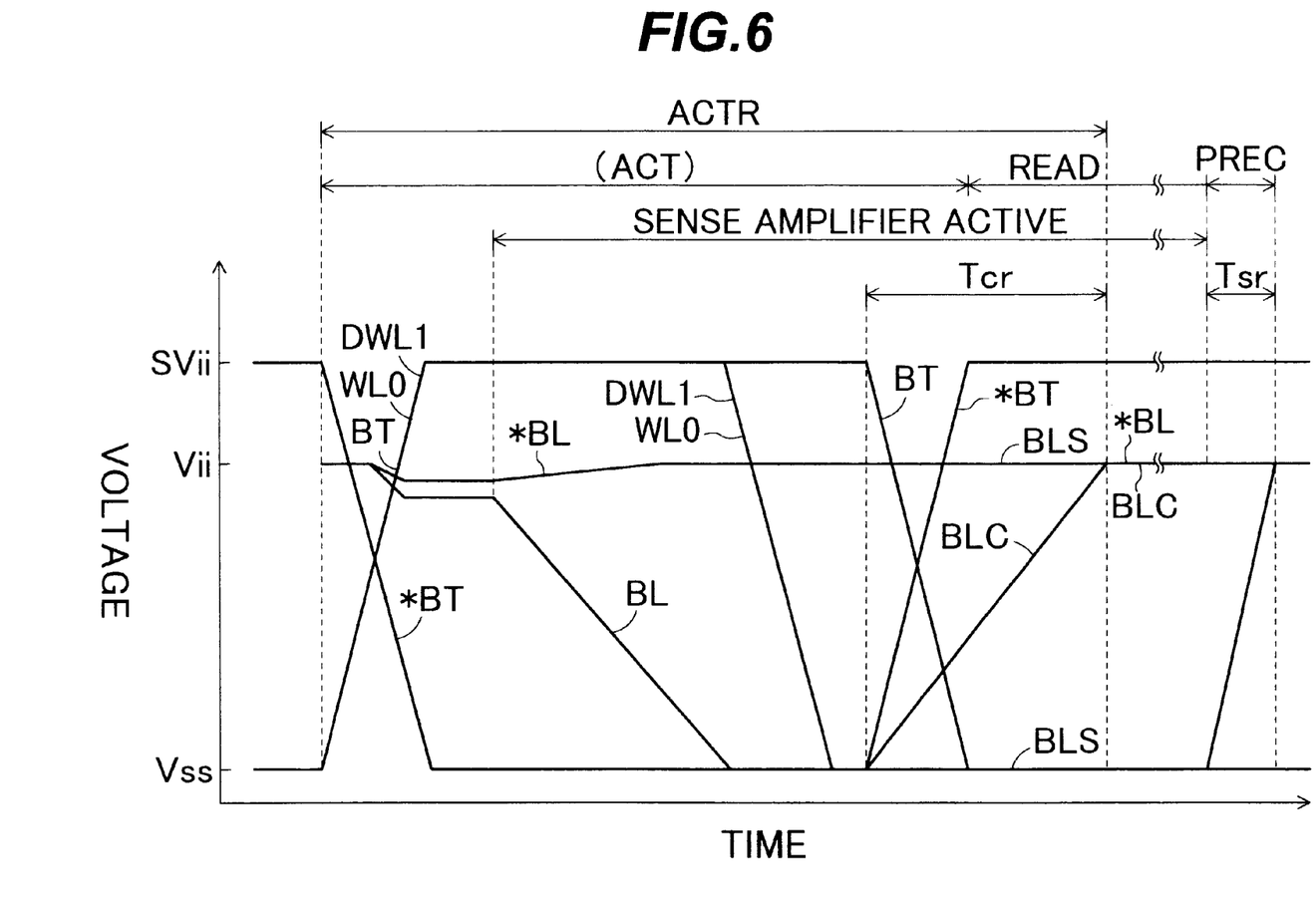
FIG. 6 is a schematic waveform chart showing the operation of the circuit of FIG. 5.

FIG. 6 is a schematic waveform chart showing the operation of the circuit of FIG. 5, and concerns the case in which 'L' is read from the memory cell 12. This operation can be understood from the description so far, and will not be explained.

Third Embodiment

Figure 7:
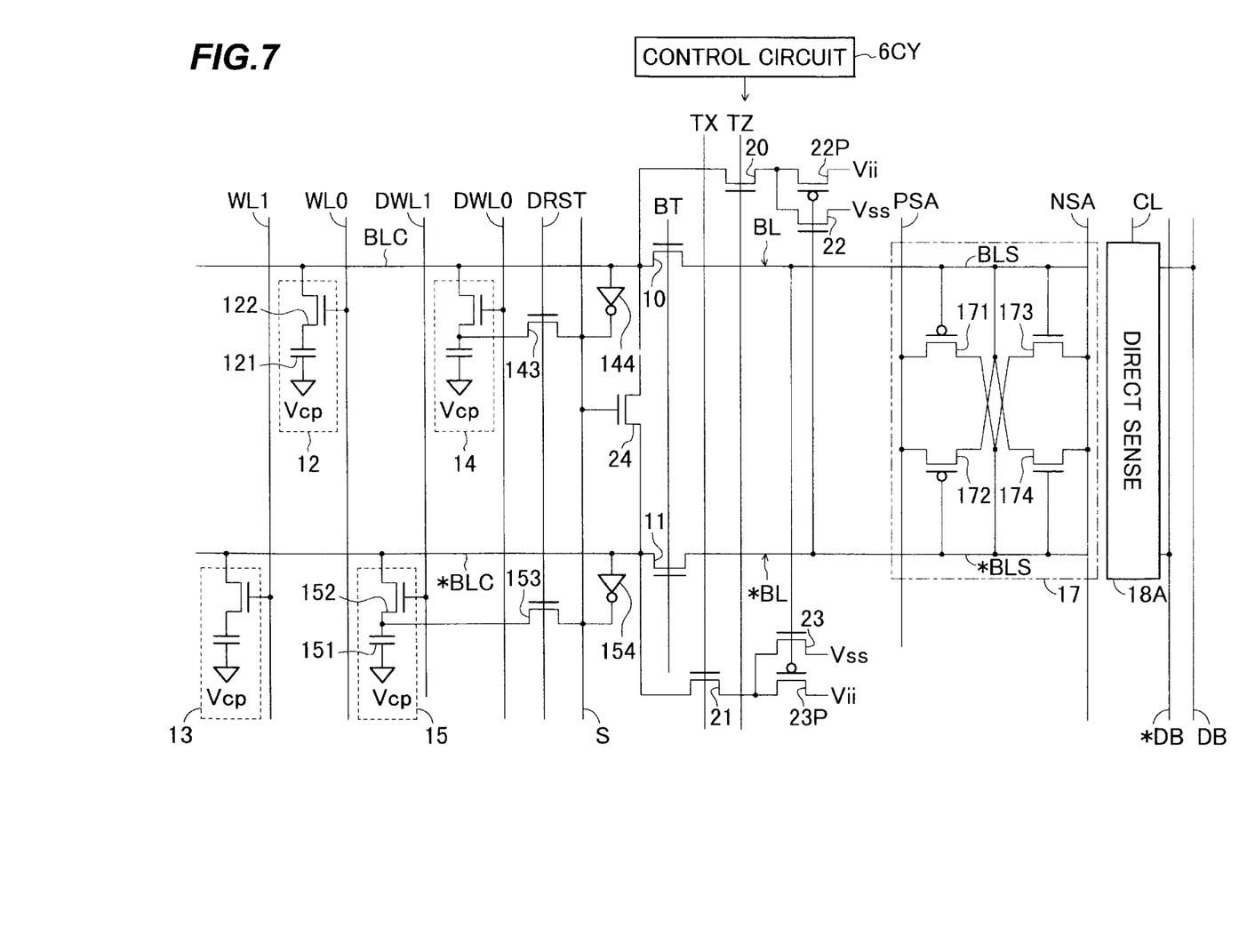
FIG. 7 is a circuit diagram as in FIG. 2 according to a third embodiment of the present invention.

FIG. 7 is a circuit diagram as in FIG. 2 according to a third embodiment of the present invention.

In FIG. 7, a well-known direct sense data read circuit 18A is used for reading data. The column gate used for writing is not shown in FIG. 7. Further, the bit line reset circuit 16 of FIG. 5 is not employed to simplifying the structure but the bit line on the sense amplifier side is reset by turning on the transfer gates 10 and 11 for a predetermined time.

In the case where 'H' is read from the memory cell connected to the bit line BLC or *BLC, the bit line potential is reset at Vii. Likewise, in reading 'L' data, the bit line potential is reset at Vss. Thereby, even if the transfer gates 10 and 11 are turned off before sufficient amplification of the potential difference between the bit lines BL and *BL, restoring data to the memory cell becomes possible by resetting the cell-side bit line because the data for restoring corresponds to the reset potential. Namely, the bit lines BLC and *BLC on the memory cell side can be isolated from the sense amplifier 17 at an early time. In addition, the memory cell destructively read out can be restored in parallel with resetting the bit line. As a result, the RAS cycle time can be shortened.

To achieve this, one end of the switching transistor 20 with the other end thereof connected to the bit line BLC is connected to the ends of the switching transistors 22 and 22P, and to the other ends of the switching transistors 22, 22P the reset potentials Vss and Vii are provided, respectively. The gate of the switching transistor 20 receives a control signal TZ which is inactivated when the gate control signal BT is active and activated for a given period only in reading the data from the memory cell connected to the bit line BLC. So the control signal TZ can be generated by use of the signal BT, the least significant bit A12 of the row address and the clock CLK, for example. The gates of the switching transistors 22, 22P are connected to the bit line *BLS.

In reading data from a memory cell connected to the bit line BLC, the switching transistor 20 is turned on. When 'H' is read from the memory cell 12 onto the bit line BL and the potential difference between the bit lines BL and *BL is amplified to some degree, the switching transistor 22P is turned on and the switching transistor 22 is turned off, thereby the potential Vii is transmitted through the switching transistors 22P and 20 to the bit line BLC, so that the amplification operation like the sense amplifier 17 does is performed for the bit line BLC. At the same time, in order to reset the bit line *BLC also at the potential Vii, an equalizer transistor 24 is connected between the bit lines BLC and *BLC. thereby, the potential Vii is also transmitted through the equalizer transistor 24 to the bit line *BLC, so that the bit line *BLC is reset at the potential Vii. The control signal S provided to the gate of the equalizer transistor 24 is made to the potential SVii soon after the gate control signal BT is made to potential Vss so as to turn on the equalizer transistor 24 soon after turning off the transfer gates 10 and 11.

When the 'L' from the memory cell 12 is read out onto the bit line BL and the potential difference between the bit lines BL and *BL is amplified to some degree, the switching transistor 22P is turned off and the switching transistor 22 is turned on. Thereby the potential Vss is transmitted through the switching transistors 22 and 20 to the bit line BLC, so that the amplification operation like the sense amplifier 17 does is performed for the bit line BLC. Further, the potential Vss is also transmitted through the equalizer transistor 24 to the bit line *BLC to reset the bit line *BLC at the potential Vss.

Likewise, one end of the switching transistor 21 with the other end thereof connected to the bit line *BLC is connected to the ends of the switching transistors 23 and 23P. To the other ends of the switching transistors 23 and 23P the reset potentials Vss and Vii are provided, respectively. The gate of the switching transistor 21 receives a control signal TX which is inactivated when the gate control signal BT is active and activated for a given period only in reading the data from the memory cell connected to the bit line *BLC. So the control signal TX can be generated by use of the signal BT, the least significant bit A12 of the row address and the clock CLK, for example. The gates of the switching transistors 23, 23P are connected to the bit line BLS.

In reading data from a memory cell connected to the bit line *BLC, the switching transistor 21 is turned on. When 'H' is read from the memory cell 13 onto the bit line *BL and the potential difference between the bit lines BL and *BL is amplified to some degree, the switching transistor 23P is turned on and the switching transistor 23 is turned off, thereby the potential Vii is transmitted through the switching transistors 23P and 21 to the bit line *BLC, so that the amplification operation like the sense amplifier 17 does is performed for the bit line *BLC. The potential Vii is also transmitted through the equalizer transistor 24 to the bit line BLC, so that the bit line BLC is reset at the potential Vii.

When the 'L' from the memory cell 13 is read out onto the bit line *BL and the potential difference between the bit lines BL and *BL is amplified to some degree, the switching transistor 23P is turned off and the switching transistor 23 is turned on. Thereby the potential Vss is transmitted through the switching transistors 23 and 21 to the bit line *BLC, so that the amplification operation like the sense amplifier 17 does is performed for the bit line *BLC. Further, the potential Vss is also transmitted through the equalizer transistor 24 to the bit line BLC to reset the bit line BLC at the potential Vss.

If the capacitor potential on the transfer gate side of the memory cell to be read next is equal to the bit line reset potential, the bit line potential remains unchanged after turning on that transfer gate. In this case, too, in order to generate a small potential difference between the bit line pair by the read operation, the capacitor potential on the transfer gate side of the dummy cell is reset at a potential corresponding to an inverted logical level of the bit line reset potential. Namely, the bit line BLC is connected through an inverter 144 and a transfer gate 143 to the electrode of the capacitor of the dummy cell 14 on the transfer gate side, while the bit line *BLC is connected through an inverter 154 and a transfer gate 153 to the capacitor of the dummy cell 15 on the transfer gate side.

Control signals in FIG. 7 are generated by a control circuit 6CY.

Figure 8:
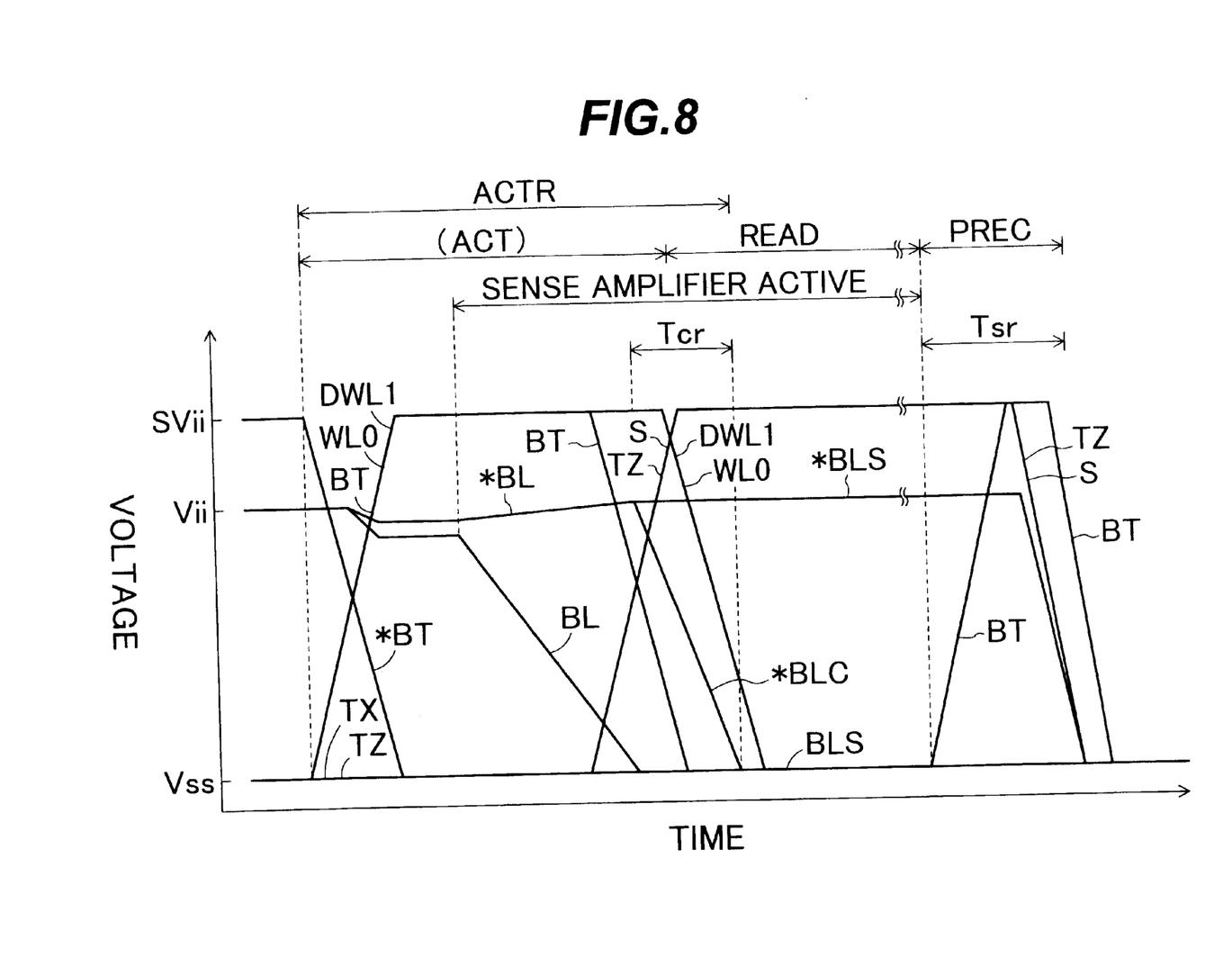
FIG. 8 is a schematic waveform chart showing the operation of the circuit of FIG. 7.

Now referring to FIG. 8, the operation of the circuit shown in FIG. 7 will be briefly described. FIG. 8 shows the case in which 'L' data is read from the memory cell 12.

Initially, the signal state is the same as that of the second embodiment described above, except that the potential of the control signals TX and TZ are Vss. The bit lines BL and *BL are set to the potential Vii.

(1B) Active Command ACTR

Under this state, the following operation is performed in response to an issue of an active command ACTR for read operation.

A word line WL0 corresponding to a row address, a dummy word line DWL1 corresponding to the least-significant bit of the row address and a gate control signal BT are activated, thereby turning on the transfer gates 122, 152, 10 and 11. The potentials of the bit lines BL and *BL drop from Vii by 2ΔV and ΔV, respectively. A potential difference ΔV is generated also between each of other bit line pairs not shown.

Then, the potential difference ΔV between the bit lines BL and *BL is amplified by the activation of the sense amplifier 17. Upon amplification of the potential difference ΔV to such an extent as to secure a proper operation of the switching transistors 22, 22P, 23 and 23P, the gate control signal BT is inactivated and the control signals TZ and S are activated, this timing is determined by a time lapse from starting of activation of the sense amplifier 17, for example. Thereby, the potential Vss is transmitted through the switching transistors 22 and 20 to the bit line BLC. Further, the potential Vss is transmitted through the equalizer transistor 24 to the bit line *BLC to reset the bit line *BLC to the potential Vss.

According to the third embodiment, this reset operation can be carried out about 5 ns earlier than in the second embodiment, and therefore the read cycle can be shortened by about 5 ns. The same applies to write cycle.

After the bit line BLC reaches approximately the potential Vss, the word line WL0 and the dummy word line DWL1 are inactivated, thereby the transfer gates 122 and 152 are turned off and the restoring 'L' to the memory cell 12 which has been destructively read from is completed. The reset and restore operation are performed similarly for the bit lines of the other bit line pairs not shown.

The reset operation is performed also for the dummy cell by the pulse of the reset signal BRST in parallel with the above bit line reset operation, so that the electrodes of the capacitors of the dummy cells 14 and 15 on the transfer gate side are reset at potential Vii. The dummy cells are reset similarly for other bit line pairs not shown.

(2B) Read Command READ

The read command READ is issued at the deactivation of the gate control signal BT in the case where a normal column gate is used for the data read operation. The use of a direct sense data read circuit 18A permits the read command READ to be issued before full swing of potential difference between the bit lines BLS and *BLS. In response to the issue of the read command READ, the following operation is performed.

The direct sense read circuit 18A corresponding to the column address is activated by activation of the column select line CL, and the data on the bit lines BLS and *BLS are transmitted through data bus lines DB and *DB to the I/O data buffer circuit 8 of FIG. 1. In the process, the pipeline processing is performed in synchronization with the clock.

(3B) Precharge Command PREC

Then, in response to the issue of the precharge command PREC, the resetting of the bit line pair on the sense amplifier side is performed by the pulse signal BT to turn on the transfer gates 10 and 11 for a predetermined time. The signals TZ and S becomes low to off the transistors 20 and 24.

The present invention includes various modifications in addition to the above-described embodiments.

Although the above-described embodiments concern the case in which the DRAM is a SDRAM, for example, the present invention is applicable to the other synchronous DRAM such as a synchronous graphic DRAM (SGDRAM) or an asynchronous DRAM. The active signal means an active command for the synchronous DRAM, and a row address strobe signal *RAS for the asynchronous DRAM. The read signal means a read command for the synchronous DRAM, and a column address strobe signal *CAS for the asynchronous DRAM. The precharge command for the synchronous DRAM is a kind of precharge signal.

Although preferred embodiments of the present invention has been described, it is to be understood that the invention is not limited thereto and that various changes and modifications may be made without departing from the spirit and scope of the invention.

For example, in FIGS. 2 and 5, as in FIG. 7, the bit line on the sense amplifier side may be reset by turning on the transfer gates 10 and 11 for a predetermined time without using the bit line reset circuit 16.

What is claimed is:

1. A memory comprising:

a bit line;

a memory cell connected to said bit line; and a bit line reset circuit for resetting said bit line to one of high and low reset potentials, said high or low reset potential being selected in response to a logic level of data read from said memory cell.

2. The memory according to claim 1, wherein said bit line reset circuit includes:

a first switching element for providing said high reset potential to said bit line;

a second switching element for providing said low reset potential to said bit line; and a reset control circuit for turning on said first switching element in response to a 'High' data read from said memory cell, and for turning on said second switching element in response to a 'Low' data read from said memory cell.

3. A memory comprising:

first and second bit lines;

a memory cell connected to said first bit line;

a bit line reset circuit for resetting said bit lines to one of high and low reset potentials, said high or low reset potential being selected in response to a logic level of data read from said memory cell.

4. The memory according to claim 3, wherein said bit line reset circuit includes:

a first switching element for providing said high reset potential to said first bit line;

a second switching element for providing said low reset potential to said first bit line; and a reset control circuit for turning on said first switching element in response to a 'High' data read from said memory cell, and for turning on said second switching element in response to a 'Low' data read from said memory cell.

5. The memory according to claim 4, further comprising:

first and second wiring;

a first transfer gate connected between said first bit line and said first wiring;

a second transfer gate connected between said second bit line and said second wiring;

a sense amplifier connected between said first and second wiring; and a gate and amplifier control circuit for turning on both of said first and second transfer gates and activating said sense amplifier to amplify a potential difference between said first and second bit lines, then for turning off both of said first and second transfer gates to reset said first and second bit lines to said reset potential by said bit line reset circuit simultaneously with activation said sense amplifier.

6. The memory according to claim 5, wherein said bit line reset circuit further includes:

a common switching element connected between said first bit line and both of said first and second switching elements; and an equalizer switching element connected between said first and second bit lines, wherein said reset control circuit turns on said common switching element and said equalizer switching element when turning off said first and second transfer gates.

7. The memory according to claim 5, further comprising:

a dummy cell connected to said second bit line, said dummy cell having a capacitor one end of said capacitor being reset with a potential inverted in the logic level from that of said second bit line.

8. A memory comprising:

first and second bit lines;

a memory cell connected to said first bit line;

first and second wirings;

a first transfer gate connected between said first bit line and said first wiring;

a second transfer gate connected between said second bit line and said second wiring;

a sense amplifier connected between said first and second wirings;

a bit line reset circuit having first and second switching elements connected in series between said first bit line and a reset potential conductor, and having third and fourth switching elements connected in series between said second bit line and said reset potential conductor, said first and third switching elements being controlled inversely to said first and second transfer gates, said second and fourth switching elements being controlled by said potential of said first or second wiring;

a gate and amplifier control circuit for turning on both of said first and second transfer gates and activating said sense amplifier to amplify a potential difference between said first and second bit lines, then for turning off both of said first and second transfer gates to reset said first and second bit lines to said reset potential by said bit line reset circuit simultaneously with activating said sense amplifier.

9. The memory according to claim 8, wherein said first and third switching elements are controlled by the same control signal as that for said first and second transfer gates.

10. The memory according to claim 8, wherein said first and third switching element are controlled by a control signal having an inverted logic level of a control signal for said first and second transfer gates.

11. A memory according to claim 8, wherein said second switching element has a control input connected to said first wiring and said fourth switching element has a control input connected to said second wiring.

12. A memory comprising:

first and second bit lines;

a memory cell connected to said first bit line;

first and second wirings;

a first transfer gate connected between said first bit line and said first wiring;

a second transfer gate connected between said second bit line and said second wiring;

a sense amplifier connected between said first and second wirings;

a bit line reset circuit connected to said first and second bit lines, for resetting said first and second bit lines to a reset potential;

a wiring reset circuit connected to said first and second wirings, for resetting said first and second wirings to said reset potential;

first and second data bus lines;

a first column gate connected between said first wiring and said first data bus line;

a second column gate connected between said second wiring and second data bus line; and a control circuit for inactivating said sense amplifier, activating said wiring reset circuit to reset said first and second wirings to said reset potential and selecting said memory cell while both of said first and second transfer gates are off, then for turning on both of said first and second transfer gates and activating said sense amplifier to amplify a potential difference between said first and second bit lines, thereafter for turning off both of said first and second transfer gates and activating said bit line reset circuit to reset said first and second bit lines to said reset potential.

13. A memory device comprising:

a pair of bit lines;

memory cells connected to said bit lines;

a sense amplifier having a pair of input/output nodes;

a pair of transfer gates connected between said pair of bit lines and said pair of input/output nodes;

a bit line reset circuit resetting said pair of bit lines into a reset potential in response to potentials at said pair of input/output nodes while said pair of transfer gates are in an 'off' state.

14. The memory device according to claim 13, wherein said reset potential is a ground potential.

15. The memory device according to claim 14, further comprising:

dummy cells connected to said bit lines, each of the dummy cells comprising a dummy cell transistor and a dummy capacitor connected in series between corresponding bit line and a reference potential, wherein a connection point between said dummy cell transistor and said dummy capacitor are reset at an internal power supply voltage.

16. The memory device according to claim 13, wherein said bit line reset circuit comprising a first switch coupled between said reset potential and one of said pair of bit lines, the first switch being conducting in response to one of said potentials at said pair of input/output nodes.

17. The memory device according to claim 16, wherein said bit line reset circuit further comprising a second switch coupled between said reset potential and other of said pair of bit lines, the second switch being conducting in response to other of said potentials at said pair of input/output nodes, wherein one of said first and second switches is conducting during a bit line reset operation.

18. The memory device according to claim 17, wherein said bit line reset circuit further comprising enable switches for coupling said first and second switches to said pair of bit lines in response to a control signal, wherein the control signal becomes an active state when said pair of transfer gates are in an 'off' state.

19. The memory device according to claim 13, further comprising:

a reset circuit for resetting said pair of inputloutput nodes of said sense amplifier at said reset potential.

20. The memory device according to claim 13, wherein said bit line reset circuit comprising:

a first switch coupled between said reset potential and one of said pair of bit lines, the first switch being conducting in response to one of said potentials at said pair of input/output nodes;

a second switch coupled between a second reset potential and said one of said pair of bit lines, the second switch being conducting in response to said one of said potentials at said pair of input/output nodes; wherein one of said first and second switches is conducting in response to said one of said potentials at said pair of input/output nodes.

* * * * *